(12) United States Patent
Bahnmueller

(10) Patent No.: US 11,119,135 B2
(45) Date of Patent: Sep. 14, 2021

(54) CIRCUIT ARRANGEMENT AND METHOD FOR RESISTANCE MEASUREMENT

(71) Applicant: Sciosense B.V., AE Eindhoven (NL)

(72) Inventor: Friedrich Bahnmueller, Karlsruhe (DE)

(73) Assignee: SCIOSENSE B.V., AE Eindhoven (NL)

( * ) Notice: Subject to any disclaimer, the term of this patent is extended or adjusted under 35 U.S.C. 154(b) by 70 days.

(21) Appl. No.: 16/605,928

(22) PCT Filed: Apr. 19, 2018

(86) PCT No.: PCT/EP2018/060043
§ 371 (c)(1),
(2) Date: Oct. 17, 2019

(87) PCT Pub. No.: WO2018/210518
PCT Pub. Date: Nov. 22, 2018

(65) Prior Publication Data
US 2020/0363458 A1    Nov. 19, 2020

(30) Foreign Application Priority Data

May 17, 2017    (EP) ...................................... 17171558

(51) Int. Cl.
*G01R 27/02* (2006.01)
*G01K 7/16* (2006.01)
*G01R 27/00* (2006.01)

(52) U.S. Cl.
CPC ............... *G01R 27/02* (2013.01); *G01K 7/16* (2013.01); *G01R 27/00* (2013.01)

(58) Field of Classification Search
CPC ........ G01R 27/00; G01R 27/02; G01R 27/14; G01K 7/00; G01K 7/16
(Continued)

(56) References Cited

U.S. PATENT DOCUMENTS 3,836,847 A * 9/1974 Lucas .................... G01R 27/02
324/607
4,907,449 A    3/1990 Call et al.
(Continued)

FOREIGN PATENT DOCUMENTS

CN    1489280 A    4/2004
CN    101154654 A    4/2008
(Continued)

OTHER PUBLICATIONS

European Patent Office, International Search Report for PCT/EP2018/060043 dated Jun. 11, 2018.
(Continued)

*Primary Examiner* — Hoai-An D. Nguyen
(74) *Attorney, Agent, or Firm* — Slater Matsil, LLP

(57) ABSTRACT

A circuit arrangement for resistance measurement comprises a capacitor coupled between a first potential node and a second potential node, a pair of terminals that comprises a first terminal and a second terminal, the first and second terminals being coupleable to one of the at least one resistor. The circuit arrangement further comprises a set of circuit branches comprising a first circuit branch, a second circuit branch, a third circuit branch and a fourth circuit branch, each comprising a switch switchable between a conductive state and an insulating state. The circuit arrangement further comprises the first terminal being coupled to the first potential node via the first circuit branch and the second circuit branch being connected in parallel. The circuit arrangement further comprises the second terminal being coupled to the second potential node via the third circuit branch and the fourth circuit branch being connected in parallel.

20 Claims, 5 Drawing Sheets

(58) Field of Classification Search
USPC .............. 324/600, 649, 691, 500, 512, 525; 702/127, 130, 133
See application file for complete search history.

(56) References Cited

U.S. PATENT DOCUMENTS

| | | | |
|---|---|---|---|
| 6,555,996 B2* | 4/2003 | Drori | H03H 7/24 |
| | | | 323/297 |
| 7,626,411 B2 | 12/2009 | Shimizume et al. | |
| 2003/0030451 A1 | 2/2003 | Braun | |
| 2005/0247997 A1* | 11/2005 | Chung | G11C 17/18 |
| | | | 257/530 |
| 2012/0182660 A1* | 7/2012 | Tong | H02H 3/24 |
| | | | 361/92 |
| 2015/0276819 A1* | 10/2015 | Zhang | H02M 3/155 |
| | | | 702/65 |
| 2016/0216301 A1 | 7/2016 | Holzworth et al. | |

FOREIGN PATENT DOCUMENTS

| | | |
|---|---|---|
| CN | 101696991 A | 4/2010 |
| CN | 103105537 A | 5/2013 |
| DE | 10119080 | 11/2002 |
| DE | 102010048677 | 4/2012 |
| FR | 2251824 | 6/1975 |
| GB | 2093300 | 8/1982 |
| JP | 2000-55954 | 2/2000 |
| JP | 6238795 B2 | 11/2017 |

OTHER PUBLICATIONS

Bing-Zhang Liu , et al., "Current Distribution in Large Current Switch Apparatus Parallel Branch," China Academic Journal Electronic Publishing House, Dec. 31, 2007, pp. 27-30.

Bing-Zhang Liu , et al., "Current Distribution in Large Current Switch Apparatus Parallel Branch," China Academic Journal Electronic Publishing House, Dec. 31, 2007.

* cited by examiner

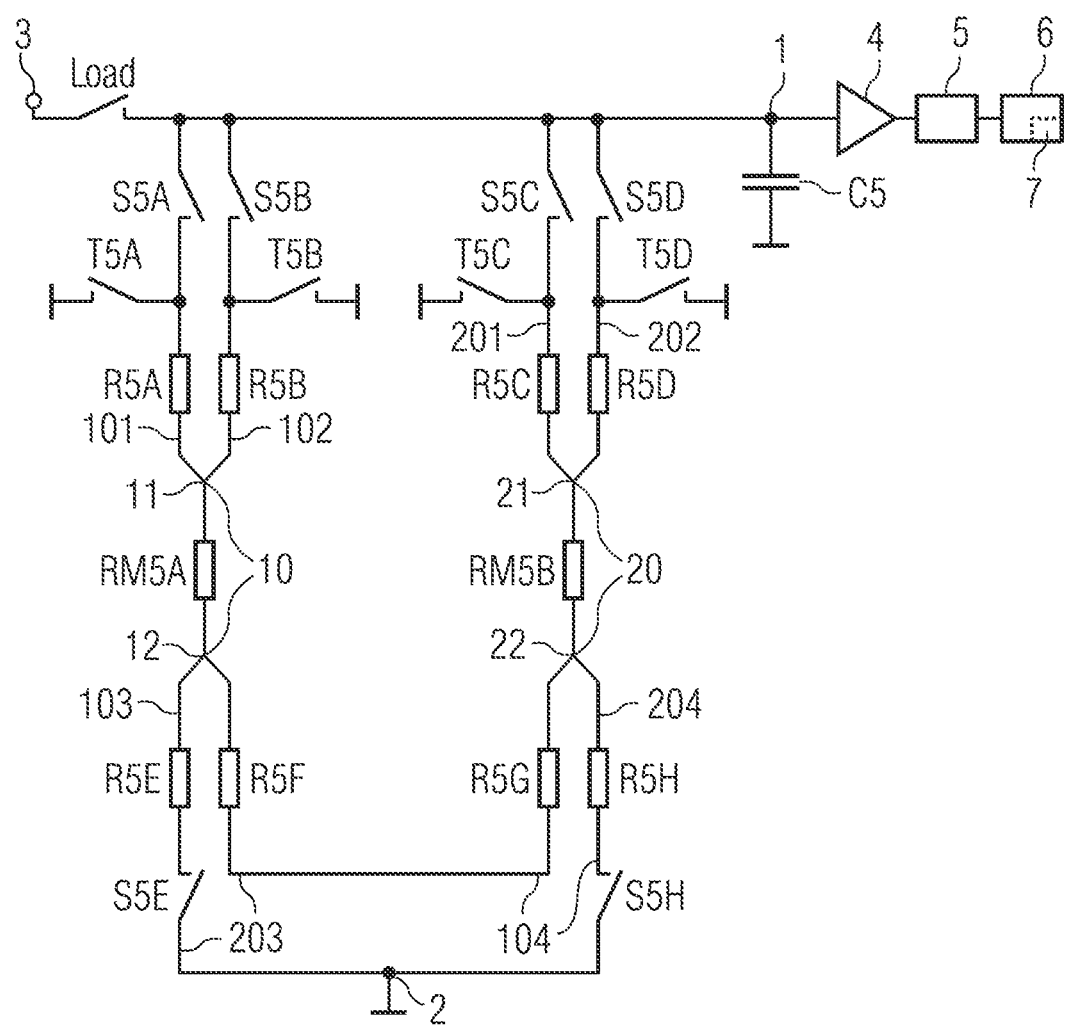

CIRCUIT ARRANGEMENT AND METHOD FOR RESISTANCE MEASUREMENT

BACKGROUND OF THE INVENTION

The present disclosure concerns a circuit arrangement for measurement of the resistance of at least one resistor and a corresponding method that are based on four-wire sensing.

Four-wire sensing is an approach to compensate out resistances of sensor lines and contact resistances of connectors. Conventional four-wire sensing wherein four sensing electrodes are connected to a resistor having a resistance to be determined is an electrical impedance measuring technique that uses separate pairs of current-carrying and voltage-sensing electrodes to make a more accurate measurement than simpler two-wire sensing using only a single pair of sensing electrodes. Separation of current and voltage electrodes eliminates wire and contact resistances from the measurement, thereby compensating out resistances of sensor lines and contact resistances of connectors.

Conventional four-wire sensing of a resistor may be performed as follows. A voltage source is connected to the resistor via conducting lines having residual resistances. A current source is connected to the resistor via further conducting lines also having residual resistances. Current is applied though the further conducting lines. Wire and contact resistances will cause voltage drops reducing the voltage at the resistor. The conducting lines connected with the voltage source will feed back the voltage drop to an excitation electronic where compensation measurement can be performed. The resistances of the conducting lines play a minor role as nearly no current is flowing.

In applications like ultrasonic heat metering, two sensor resistors each having a resistance to be determined are necessary for temperature measurement in an outgoing line and an incoming line. Resistive measurement usually uses an analog-to-digital converter (ADC).

Document DE 102010048677 A1 shows a circuit for measuring a discharge time of a capacitor via at least one resistor. The document shows resistance measurement including charging and discharging with a connection and control scheme in order to improve electromagnetic compatibility (short EMC) behaviour of the circuit. The main idea is to pull down unused sensor lines which might act like antennas to ground by means of transistors, which reduces the size of the EMC sensitive antennas.

Document DE 10119080 A1 shows a circuit arrangement for resistance measurement which allows eliminating the disturbing influence of resistance values of electronic switches. Resistance measurement is performed over a capacitor that is repeatedly charged and discharged. A series connection of a resistor and two switches in parallel are connected to the capacitor in parallel. Several measurements are performed. The document shows a load and discharge scheme for the measurement. The resistances of the switches are measured and compensated in digital post-processing as exemplarily shown in the document. The arrangement is limited to three wire sensors wherein line or contact resistances on one side of the resistor are not compensated.

SUMMARY OF THE INVENTION

The present disclosure provides an improved circuit arrangement for resistance measuring and a corresponding method.

The circuit arrangement is provided for resistance measurement of at least one resistor. The circuit arrangement comprises:
- a capacitor being coupled between a first potential node and a second potential node,
- a pair of terminals that comprises a first terminal and a second terminal, the first and second terminals being coupleable to one of the at least one resistor,
- as set of circuit branches comprising a first circuit branch that comprises a switch, a second circuit branch that comprises a switch, a third circuit branch that comprises a switch, and a fourth circuit branch that comprises a switch,
- the switches being switchable between a conductive state and an insulating state,
- the first terminal being coupled to the first potential node via the first circuit branch and the second circuit branch, the first and second circuit branches being connected in parallel,
- the second terminal being coupled to the second potential node via the third circuit branch and the fourth circuit branch, the third and fourth circuit branches being connected in parallel.

This circuit arrangement allows resistance measurement of a resistor connected to the first and second terminals. Moreover, the arrangement allows port compensation at both sides of the resistor since the resistance of the branches may be eliminated.

The resistance of the resistor may depend on environmental conditions. Thus, the resistor may be suitable for sensing environmental values, e.g. temperature. Such a resistor may be called a sensor resistor or just a sensor.

Resistance measurement by means of the above-mentioned arrangement is based on charging or, preferably, discharging the capacitor through at least some of the circuit branches and the resistor. Several measurement steps may be performed by charging or discharging the capacitor via at least one of the first and second branches, the resistor and at least one of the third and fourth branches. The combination of different switching states of the switches allows to form different current paths from the first to the second potential nodes. A respective charge or discharge time of the capacitor depends on the resistance of the resistor and the wire and contact resistances of the circuit branches having a switch in the conductive state; branches with switches being in the insulating state are not taken into account.

Four-wire connecting of the resistor by means of the circuit branches is used to achieve the highest accuracy by elimination of the connection line resistances of the circuit branches. Furthermore the approach is suitable for cancelling out the contact resistances of connectors.

One embodiment of the circuit arrangement may be suitable for measuring the resistances of a first resistor and a second resistor. The circuit arrangement further comprises a second pair of terminals and a second set of circuit branches, which are coupled to the first and second nodes in the above-mentioned manner.

The circuit arrangement may be embodied as an integrated chip to which the resistors to be measured may be connected. A four-wire sensor resistor typically has four connections to the sensor chip; two four-wire-sensor resistors typically have eight connections to the sensor chip.

In the latter case, there are no direct conductive connections between the first terminals of the first and second pairs and between the second terminals of the first and second pairs. In other words, there is no terminal-to-terminal strip conductor or wire between the terminals. Nevertheless, they may be coupled by means of the switches as mentioned above.

In an alternative embodiment, the first terminals or the second terminals of the first and second pairs are connected by a direct conductive connection, e.g. a conducting line or a strip conductor. It should be pointed out that the direct conductive connection has an inherent resistivity although there are no components being coupled between the terminals by the direct conductive connection.

If the first terminals are directly connected, the first circuit branches of the first and second sets comprise the same switch and the second circuit branches of the first and second sets comprise the same switch. In other words, the switch comprised by the first circuit branch of the first set and the switch comprised by the first circuit branch of the second circuit set are the same switch since the first circuit branch of the second set comprises the direct conductive connection between the first terminals and the first circuit branch of the first set. The switch comprised by the second circuit branch of the first set and the switch comprised by the second circuit branch of the second circuit set are the same switch since the second circuit branch of the first set comprises the direct conductive connection between the first terminals and the second circuit branch of the second set.

If the second terminals are directly connected, the third circuit branches of the first and second sets comprise the same switch and the fourth circuit branches of the first and second sets comprise the same switch. In other words, the switch comprised by the third circuit branch of the first set and the switch comprised by the third circuit branch of the second circuit set are the same switch since the third circuit branch of the second set comprises the direct conductive connection and the third circuit branch of the first set. The switch comprised by the fourth circuit branch of the first set and the switch comprises by the fourth circuit branch of the second circuit set are the same switch since the fourth circuit branch of the first set comprises the direct conductive connection and the fourth circuit branch of the second set.

One embodiment of the circuit arrangement may be suitable for measuring the resistances of three resistors. In this case, it comprises a third pair of terminals and a third set of circuit branches. The first terminal of the third pair is coupled to the first potential node via the first and second circuit branches of the third set that are connected in parallel. The second terminal of the third pair of terminals is coupled to the second potential node via the third and fourth branches of the third set that are connected in parallel. Preferably, there is no direct conductive connection between at least two of the first terminals of the first, second and third pairs and no direct conductive connection between at least two of the second terminals of the first, second and third pairs. Thus, four switches or less may be provided for each resistor.

The first terminals of first and second pairs may be connected by a direct conductive connection. Thereby the first circuit branches of the first and second sets comprise the same switch and the second circuit branches of the first and second sets comprise the same switch. The remarks above in connection with two branches having the same switch also apply in this and the following cases. Alternatively or additionally, the second terminals of the second and third pairs are connected by a direct conductive connection. Thereby the third circuit branches of the second and third sets comprise the same switch and the fourth circuit branches of the second and third sets comprise the same switch.

Despite different wording the above-mentioned circuit topology is equivalent with the following one: The second terminals of first and second pairs may be connected by a direct conductive connection. Thereby the third circuit branches of the first and second sets comprise the same switch and the fourth circuit branches of the first and second sets comprise the same switch. Alternatively or additionally, the first terminals of the second and third pairs are connected by a direct conductive connection. Thereby the first circuit branches of the second and third sets comprise the same switch and the second circuit branches of the second and third sets comprise the same switch.

One embodiment of the circuit arrangement may be suitable for measuring the resistances of four resistors. It further comprises a fourth pair of terminals and a fourth set of circuit branches. Direct conductive connections between the terminals of different pairs may be provided, which would allow reduction of the number of switches.

In one embodiment, the first terminals of the first and second pairs are connected by a direct conductive connection. The first circuit branches of the first and second sets comprise a same switch and the second circuit branches of the first and second sets comprise the same switch. Alternatively or additionally, the second terminals of second and third pairs are connected by a direct conductive connection. Thereby the third circuit branches of the second and third sets comprise the same switch and the fourth circuit branches of the second and third sets comprise the same switch. Alternatively or additionally, the first terminals of third and fourth pairs are connected by a direct conductive connection. Thereby the first circuit branches of the third and fourth sets comprise the same switch and the second circuit branches of the third and fourth sets comprise the same switch. Moreover, the second terminals of first and fourth pairs may be connected by a direct conductive connection. Thus, the third circuit branches of the first and fourth sets may comprise a same switch and the fourth circuit branches of the first and fourth sets comprise the same switch. Only eight pins for sensor resistor control may be required for such a four-wire sensing arrangement for four resistors.

Despite different wording the above-mentioned circuit topology is equivalent with the following one: The second terminals of the first and second pairs are connected by a direct conductive connection. The third circuit branches of the first and second sets comprise a same switch and the fourth circuit branches of the first and second sets comprise the same switch. Alternatively or additionally, the first terminals of second and third pairs are connected by a direct conductive connection. Thereby the first circuit branches of the second and third sets comprise the same switch and the second circuit branches of the second and third sets comprise the same switch. Alternatively or additionally, the second terminals of third and fourth pairs are connected by a direct conductive connection. Thereby the third circuit branches of the third and fourth sets comprise the same switch and the fourth circuit branches of the third and fourth sets comprise the same switch.

Moreover, the first terminals of first and fourth pairs may be connected by a direct conductive connection. Thus, the first circuit branches of the first and fourth sets may comprise a same switch and the second circuit branches of the first and fourth sets comprise the same switch.

Reducing the number of switches as exemplarily described above may reduce the number of pins on the chip integrating the circuit arrangement while maintaining all advantages of four-wire sensor measurements. The benefit of reducing the number of pins causes reduction of costs and chip size, which may result in smaller package and smaller dice.

Reducing the number of switches may be performed in accordance with one or more of the following—not limiting—rules: One of the first or second terminals is connected to the first or second node, respectively, by at least one branch, which might reduce the number of switches in a set of branches to four. There are two direct conductive connections connected with one pair of terminals; one direct conductive connection being connected with the first terminals of said pair and another pair; the other direct conductive connection being connected with the second terminals of said pair and yet another pair.

Since the sensor lines may be sensitive to electromagnetic disturbances, shorting their parts that act like sensitive antennas may be achieved by a switchable means for connecting one of the switches with a ground potential if the switch is in the insulating state. Thus, EMC performance may be improved.

The circuit arrangement further comprises a voltage or a current source for charging the capacitor and a sensor for measuring a charge or discharge time of the capacitor. Such sensor may be embodied as a threshold switch for detecting voltage increase or decrease and a downstream time-to-digital converter. These components allow resistive measurement based on the discharge of the capacitor via the resistor and measuring the charge or preferably discharge time of the capacitor by the time-to-digital converter (TDC). Resistive measurement with four-wire sensors and a time-to-digital converter has not been established yet. Providing a time-to-digital converter makes TDC-based resistance measurement applicable to four-wire sensing measurement with a reduced number of pins.

The circuit arrangement further comprises a switch controller for setting a multitude of switch settings, in each switch setting the states of the switches are set in such a manner that the capacitor is chargeable or dischargeable via at least one of the first and second branches of a same set and at least one of the third and fourth branches of the same set and the resistor coupled to the terminals that are coupled to the same set. A processor is provided for determining the resistance value of the resistor based on measurements of the charge or discharge times for the multitude of switch settings. The calculation eliminates the influences of the resistances of the branches.

The method for resistance measurement by the circuit arrangement above wherein the resistor is connected to the pair of terminals comprises: charging and discharging the capacitor, setting a switch setting and measuring a charge or discharge time of the capacitor for the switch setting. In the switch setting, the switches are in such states that the capacitor is charged or discharged via a current path along at least one of the first and second branches, the resistor and at least one of the third and fourth branches.

When measuring the resistances of more than one resistor, each pair of terminals is connected to one resistor. The method comprises: charging and discharging the capacitor, setting a switch setting and measuring a charge or discharge time of the capacitor for the switch setting. In the switch setting, the switches of the set are in such states that the capacitor is charged or discharged via a current path along at least one of the first and second branches of a same set, the resistor connected to terminals of the same set and at least one of the third and fourth branches of the same set.

The charge or discharge times are measured in connection with a multitude of switch settings forming different current paths for charge or discharge from the first to the second potential node via a same resistor and calculating the resistance value of the same resistor based on measurements of the charge or discharge times for the multitude of switch settings.

BRIEF DESCRIPTION OF THE DRAWINGS

Non-limiting, exemplary embodiments of the invention will now be described with reference to the accompanying drawings, in which:

FIG. 5 shows a circuit diagram of a fifth embodiment of a circuit arrangement.

DETAILED DESCRIPTION

Figure 1:
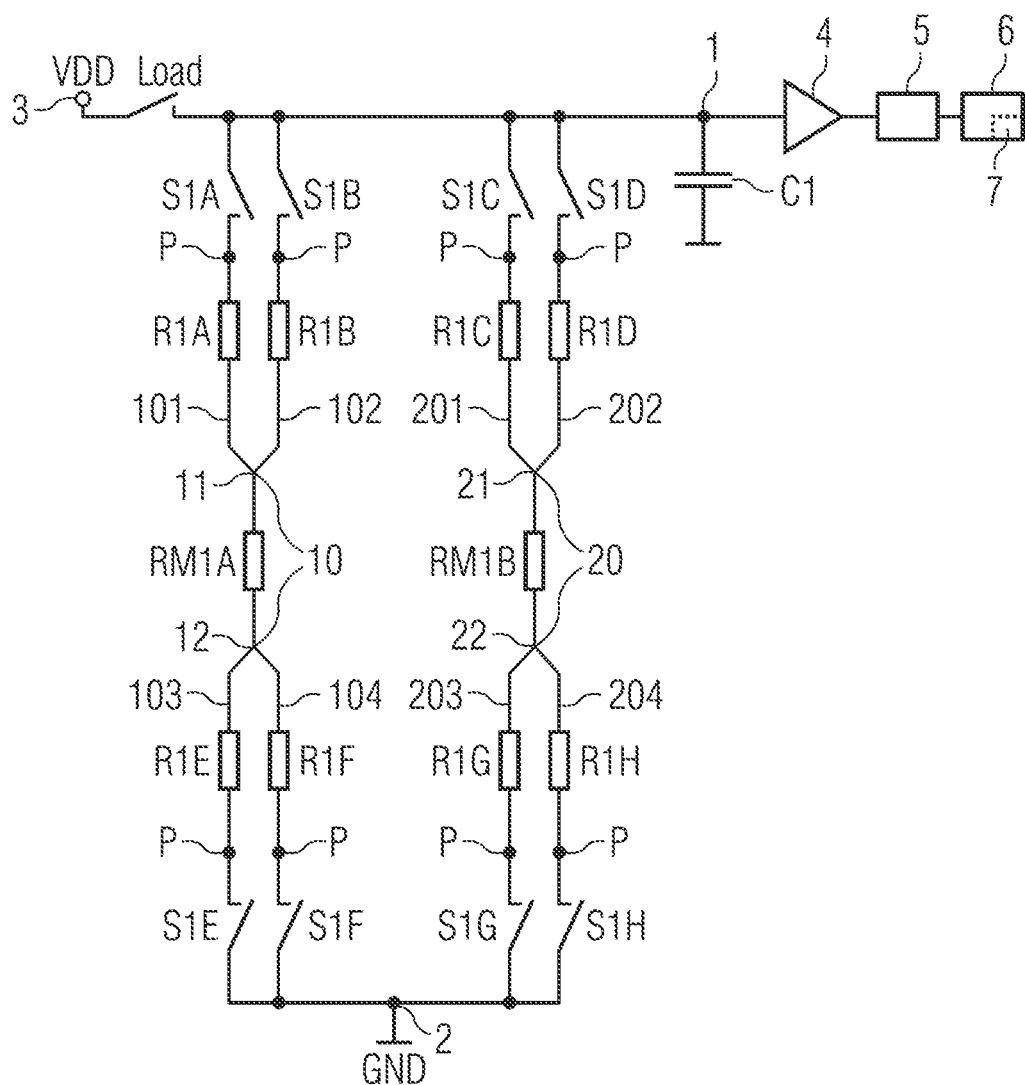
FIG. 1 shows a circuit diagram of a first embodiment of a circuit arrangement.

FIG. 1 shows a circuit diagram of a first embodiment of a circuit arrangement. The arrangement comprises a supply node 3 to which a supply potential VDD or current source may be applied. The supply node 3 is connected via a switch LOAD to a first potential node 1. A capacitor C1 is coupled between the first potential node 1 and a second potential node 2 that is ground potential GND in this embodiment.

A series connection of a threshold switch 4, a downstream time-to-digital converter 5, abbreviated as TDC, and a downstream processing unit 6, e.g. a microprocessor, is coupled to the first potential node 1. The threshold switch 4 is suitable for detecting whether an input signal provided at the first node 1 and applied to the threshold switch 4 is within or beyond a given range. Its output is coupled to the time-to-digital converter 5, which allows detection of the period of time for increase or decrease of the input signal. Data representing the period of time is provided to the processing unit 6 that may process the measurement data in order to determine resistance values.

The circuit arrangement allows determining resistance values of a first resistor RM1A and a second resistor RM1B that are coupleable between a pair 10, 20 of terminals each. In this embodiment, the first resistor RM1A is coupled between a first terminal 11 and a second terminal 12 of a first pair 10 of terminals. The second resistor RM1B is coupled between a first terminal 21 and a second terminal 22 of a second pair 20 of terminals.

The first terminal 11 of the first pair 10 is connected via a first circuit branch 101 to the first potential node 1. The first circuit branch 101 comprises a resistor R1A and a switch S1A. The first terminal 11 of the first pair 10 is connected via a second circuit branch 102 to the first potential node 1. The second circuit branch 102 comprises a resistor R1B and a switch S1B.

The second terminal 12 of the first pair 10 is connected via a third circuit branch 103 to the second potential node 2. The third circuit branch 103 comprises a resistor R1E and a switch S1E. The second terminal 12 of the first pair 10 is connected via a fourth circuit branch 104 to the second potential node 2. The fourth circuit branch 104 comprises a resistor R1F and a switch S1F.

The first terminal 21 of the second pair 20 is connected via a first circuit branch 201 to the first potential node 1. The first circuit branch 201 comprises a resistor R1C and a switch S1C. The first terminal 21 of the first pair 20 is connected via a second circuit branch 202 to the first potential node 1. The second circuit branch 202 comprises a resistor R1D and a switch S1D.

The second terminal 22 of the second pair 20 is connected via a third circuit branch 203 to the second potential node 2. The third circuit branch 203 comprises a resistor R1G and a switch S1G. The second terminal 22 of the second pair 20 is connected via a fourth circuit branch 204 to the second potential node 2. The fourth circuit branch 204 comprises a resistor R1H and a switch S1H.

The resistors R1A, R1B, R1C, R1D, R1E, R1F, R1G, R1H of the first, second, third and fourth circuit branches 101, 102, 103, 104, 201, 202, 203, 204 are usually not discrete components but represent line, switch and contact resistances of switchable resistive connections, which are the circuit branches 101, 102, 103, 104, 201, 202, 203, 204 connected between the terminals 11, 12, 21, 22 and the first and second nodes 1, 2. In other words, the resistances of connections, e.g. connection lines, to the first and second resistors RM1A, RM1B are modelled by the resistors R1A, R1B, R1C, R1D, R1E, R1F, R1G, R1H.

Each switch LOAD, S1A, S1B, S1C, S1D, S1E, S1F, S1G, S1H is switchable between a conductive state, also called ON, and an insulating state, also called OFF. A current may flow along one of the branches 101, 102, 103, 104, 201, 202, 203, 204 if its switch S1A, S1B, S1E, S1F, S1C, S1D, S1G, S1H is ON; but the current cannot do so if its switch S1A, S1B, S1E, S1F, S1C, S1D, S1G, S1H is OFF. The switches LOAD, S1A, S1B, S1C, S1D, S1E, S1F, SIG, S1H may be switchable by a switch controller 7 for setting and changing the states of the switches LOAD, S1A, S1B, S1C, S1D, S1E, S1F, S1G, S1H. The switch controller 7 may be part of the processing unit 6, as indicated in FIG. 1. Alternatively, it may be a discrete module or component controlled by the processing unit 6.

The switches LOAD, S1A, S1B, S1C, S1D that are connected to the first node 1 may be preferably formed by CMOS analog switches. The switches S1E, S1F, S1G, S1H that are connected to the second node 2 may be preferably formed by NMOS transistors to ground.

The circuit arrangement may be embodied by a chip integrating the switches LOAD, S1A, S1B, S1C, S1D, S1E, S1F, S1G, S1H, the threshold switch 4, the time-to-digital converter 5, the switch controller 7 and the processing unit 6. Such a chip may have eight pins being connected with conducting lines on a printed circuit board, short PCB; the conducting lines running toward the pairs 10, 20 of terminals that are also provided on the printed circuit board. The arrangement of the pins within the circuit diagram is indicated by nodes P in FIG. 1. The pairs 10, 20 of terminals are connectable with the first and second resistors RM1A, RM1B.

The above circuit arrangement indicates a connection scheme of two four-wire sensor resistors with eight ports or pins.

Resistance measurement by the above-mentioned circuit arrangement is performed by charging the capacitor C1 by setting the switch LOAD into the conductive state where the other switches S1A, S1B, S1C, S1D, S1E, S1F, S1G, S1H are OFF. A voltage source may be provided at the supply node 3. Alternatively, a current source may be provided. Then the switch LOAD is set into the insulating state and the switches S1A, S1B, S1E, S1F of the branches 101, 102, 103, 104 connected with the first pair 10 of terminals are set in such a manner that they allow discharging the capacitor C1 so that a current flows along at least one of the first and second branches 101, 102, the first resistor RM1A and at least one of the third and fourth branches 103, 104. Several charging and discharging steps are performed; the latter having different current paths along at least one of the first and second branches 101, 102, the first resistor RM1A and at least one of the third and fourth branches 103, 104. Further charging and discharging steps are performed; the latter having different current paths along at least one of the first and second branches 201, 202 connected to the second pair 20, the second resistor RM2A and at least one of the third and fourth branches 203, 204 connected to the second pair 20.

The following table shows a control scheme for controlling the switches LOAD, S1A, S1B, S1C, S1D, S1E, S1F, S1G, S1H; it will be explained below.

| Step | LOAD | S1A | S1B | S1C | S1D | S1E | S1F | S1G | S1H |
|------|------|-----|-----|-----|-----|-----|-----|-----|-----|
| 100  | ON   | OFF | OFF | OFF | OFF | OFF | OFF | OFF | OFF |
| 101  | OFF  | ON  | ON  | OFF | OFF | ON  | ON  | OFF | OFF |
| 102  | OFF  | ON  | OFF | OFF | OFF | ON  | ON  | OFF | OFF |
| 103  | OFF  | OFF | ON  | OFF | OFF | ON  | ON  | OFF | OFF |
| 104  | OFF  | ON  | ON  | OFF | OFF | ON  | OFF | OFF | OFF |
| 105  | OFF  | ON  | ON  | OFF | OFF | OFF | ON  | OFF | OFF |
| 106  | OFF  | OFF | OFF | ON  | ON  | OFF | OFF | ON  | ON  |
| 107  | OFF  | OFF | OFF | ON  | OFF | OFF | OFF | ON  | ON  |
| 108  | OFF  | OFF | OFF | OFF | ON  | OFF | OFF | ON  | ON  |
| 109  | OFF  | OFF | OFF | ON  | ON  | OFF | OFF | ON  | OFF |
| 110  | OFF  | OFF | OFF | ON  | ON  | OFF | OFF | OFF | ON  |

The left column "step" shows an identifier for a switch setting which is the combination of the states of the switches in the respective row during one charging or discharging step. The headers of the other columns indicate the switches those states are shown in the column below.

Considering the second line, "step 100" is a switch setting where only the switch LOAD is conductive, which allows to charge the conductor C1.

Considering the third line, "step 101" is a switch setting, where the switch LOAD is in an insulating state and only the switches S1A, S1B, S1E, S1F in the first, second third and fourth branches 101, 102, 103, 104 that are connected to the first pair 10 are conductive. In this step, the capacitor C1 is discharged via these branches 101, 102, 103, 104 and the first resistor RM1A. The threshold switch 4 detects the time from decrease of the voltage at the capacitor C1 between two given thresholds. The digital-to-time converter 5 provides the respective value to the processing unit 6.

Considering discharging a capacitor C via a resistor R that is connected in parallel (not shown), the discharge time constant of the capacitor C and the resistor R is $T=R*C$.

Going back to step 101, wherein the capacitor C1 is discharged via a series connection of the resistors R1A and R1B in parallel and the first resistor RM1A and the resistors R1E and R1F in parallel the discharge time T101 is:

$$T101=(R1A\|R1B+RM1A+R1E\|R1F)*C1,$$

wherein "$\|$" is an operator that indicates a parallel connection of two resistors. $R1A\|R2A$ is the resistance of R1A and R2A in parallel, which means $(R1A*R2A)/(R1A+R2A)$ and $R1E\|R2F$ is the resistance of R1E and R2F in parallel, which means $(R1E*R2F)/(R1E+R2F)$.

Considering the fourth line, "step 102" is a switch setting, where the switch LOAD is in an insulating state and only the switches S1A, S1E, S1F in the first, third and fourth branches 101, 103, 104 that are connected to the first pair 10 are conductive.

In step 102, the capacitor C1 is discharged via a series connection of the resistor R1A and the first resistor RM1A and the resistors R1E and R1F in parallel. The discharge time T102 is:

$$T102=(R1A+RM1A+R1E\|R1F)*C1.$$

Other measuring steps' times are indicated by the table and their discharge times may be determined in an equivalent way. Before each step 101-110 of the control scheme the charging step 100 is performed in order to load the capacitor before discharge. Ten discharge steps are necessary to measure and compensate all ten resistors in the circuit arrangement.

The discharge times of the steps 101-110 depend on the resistors as follows:

$$T101=(R1A\|R1B+RM1A+R1E\|R1F)*C1 \quad (101)$$

$$T102=(R1A+RM1A+R1E\|R1F)*C1 \quad (102)$$

$$T103=(R1B+RM1A+R1E\|R1F)*C1 \quad (103)$$

$$T104=(R1A\|R1B+RM1A+R1E)*C1 \quad (104)$$

$$T105=(R1A\|B+RM1A+R1F)*C1 \quad (105)$$

$$T106=(R1C\|R1D+RM1B+R1G\|R1H)*C1 \quad (106)$$

$$T107=(R1C+RM1B+R1G\|R1H)*C1 \quad (107)$$

$$T108=(R1D+RM1B+R1G\|R1H)*C1 \quad (108)$$

$$T109=(R1C\|R1D+RM1B+R1G)*C1 \quad (109)$$

$$T110=(R1C\|R1D+RM1B+R1H)*C1 \quad (110)$$

Each step 101-110 of the control scheme corresponds to one discharge of the capacitor C1 and the time measurement of its discharge time T101-T110.

Five measurement steps are performed for determining the resistance value of the first resistor RM1A. The respective five discharge times T101-T105 depend on the five resistors RM1A, R1A, R1B, R1E, R1F and may be described by the set of equations (101)-(105) above. Since there are five unknown resistance values in the set of five equations, the values may be determined. The first resistor RM1A may be calculated by substituting and solving. Thus, the value of RM1A*C1 depends on a post-processing function f1 of measuring discharge times:

$$RM1A*C1=f1(T101,T102,T103,T104,T105).$$

The above applies to the calculation of the resistance value of the second resistor RM1B based on the set of equations (106)-(110). The value of RM1B*C1 depends on a post-processing function f2 of measuring discharge times:

$$RM1B*C1=f2(T106,T107,T108,T109,T110).$$

The remaining capacitor C1, if not known, may be cancelled out by calculation of the ratio of the sensor resistors RM1A und RM1B:

$$V=RM1A/RM1B=f1(T101,T102,T103,T104,T105)/f2(T106,T107,T108,T109,T110).$$

In other words, if the value of one of the first and second resistors RM1A und RM1B is known, the other one may be calculated exactly. Such a known resistor may be a reference resistor.

It should be pointed out that variants of the control scheme and the resulting equations are possible since there are more than five different current paths from the first node 1 through one of the first and second resistors RM1A and RM1B to the second node 2. Nevertheless, only five different current paths are needed for measurement and evaluation of one of the first and second resistors RM1A and RM1B.

In order to determine the first and second resistors RM1A and RM1B, the resistors R1A, R1B, R1C, R1D, R1E, R1F, R1G, R1H that represent connection line resistances have to be measured and considered for compensation. The control of the measurement steps and their evaluation is performed by the processing unit 6 and the switch control 7.

Figure 2:
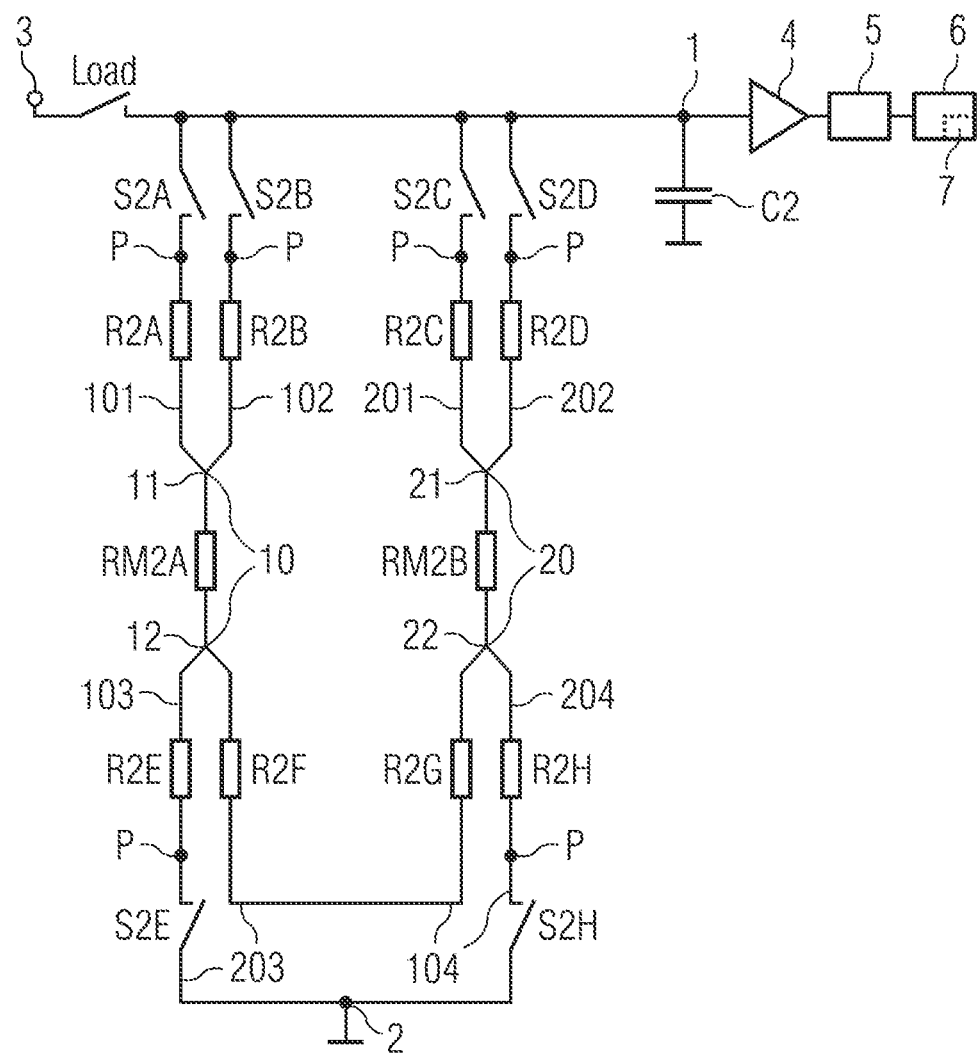
FIG. 2 shows a circuit diagram of a second embodiment of a circuit arrangement.

FIG. 2 shows a second embodiment of a circuit arrangement. To avoid a mere repetition of information, the following description of the embodiment concentrates on the differences between FIGS. 1 and 2.

The switches S2A, S2B, S3C, S3D, S2E, S2H and the resistors RM2A, RM2B, R2A, R2B, R2C, R2D, R2E, R2H and the capacitor C2 are coupled in the same manner as the switches S1A, S1B, S1C, S1D, S1E, S1H and the resistors RM1A, RM1B, R1A, R1B, R1C, R1D, R1E, R1H and the capacitor C1, respectively, as shown in FIG. 1.

However, the second terminal 12 of the first pair 10 is connected via resistors R2F and R2G to the second terminal 22 of the second pair 20. The fourth circuit branch 104 connected with the first pair 10 runs from the second terminal 12 of the first pair 10 via the second terminal 22 of the second pair 20 to the second potential node 2 and includes the resistors R2F, R2G that are connected between the second terminals 12, 22 and the resistor R2H and the switch S2H. The resistors R2F and R2G may represent the line and contact resistances of a conducting line that is a direct conductive connection between the second terminals 12, 22. The resistor R2H and the switch S2H indicate a switchable resistive connection between the second terminal 22 of the second pair 20 and the second potential node 2.

The third circuit branch 203 connected with the second pair 20 runs from the second terminal 22 of the second pair 20 via the second terminal 12 of the first pair 12 to the second potential node 2 and includes the resistors R2G, R2F that are connected between the second terminals 12, 22 and the resistor R2E and the switch S2E. The resistor R2E and the switch S2E indicate a switchable resistive connection that is a direct conductive connection between the second terminal 12 of the first pair 10 and the second potential node 2.

Thus, the fourth circuit branch 104 connected to a first pair 10 and the fourth circuit branch 204 connected to the second pair 20 have the resistor R2H and the switch S2H in common. Moreover, the third circuit branch 203 connected to the second pair 20 and the third circuit branch 103 connected to the first pair 10 have the resistor R2E and the switch S2E in common.

The circuit arrangement may be embodied by a chip integrating the switches LOAD, S1A, S1B, S1C, S1D, S1E, S1H, the threshold switch 4, the time-to-digital converter 5, the switch controller 7 and the processing unit 6. Such a chip may have six pins, indicated by nodes P in FIG. 2, being connected with conducting lines on a printed circuit board; the conducting lines running toward the pairs 10, 20 of terminals that are also provided on the printed circuit board. The conducting line that is a direct conductive connection between the second terminals 12, 22 may be embodied on the printed circuit board, too. Thus, this circuit arrangement saves two pins in comparison with the arrangement shown in FIG. 1.

The circuit arrangement in FIG. 2 indicates a connection scheme for two four-wire sensor resistors with six ports or pins. Two lines of the sensor resistors are not connected to the chip by switch; they are just directly connected on the printed circuit board, which allows to reduce the number of pins from eight to six for two four-wire sensor resistors. Two pins are shared by both sensor resistors.

Resistance measurement by the above-mentioned circuit arrangement is performed by charging the capacitor C2 by setting the switch LOAD into the conductive state. Then the switch LOAD is set into the insulating state and the switches of the branches 101, 102, 103, 104 connected with the first pair 10 of terminals are set in such a manner that they allow discharging the capacitor C2 so that a current flows along at least one of the first and second branches 101, 102, the first resistor RM2A and at least one of the third and fourth branches 103, 104. Several charging and discharging steps are performed; the latter having different current paths along at least one of the first and second branches 101, 102, the first resistor RM2A and at least one of the third and fourth branches 103, 104. Further charging and discharging steps are performed; the latter having different current paths along at least one of the first and second branches 201, 202 connected to the second pair 20, the second resistor RM2B and at least one of the third and fourth branches 203, 204.

If the current path through the first resistor RM2A includes the third circuit branch 103, the switch S2E is ON, thereby the current may flow via the resistor R2E. If the current path through the first resistor RM2A includes the fourth circuit branch 104, the switch S2H is ON, thereby the current may flow via the resistors R2F, R2G, R2H.

If the current path through the second resistor RM2B includes the third circuit branch 203, the switch S2E is ON, thereby the current may flow via the resistor R2G, R2F, R2E. If the current path through the second resistor RM2B includes the fourth circuit branch 204, the switch S2H is ON, thereby the current flows via the resistor R2H.

The discharge times may depend on the following resistances: RM2A, R2A, R2B, R2E, R2F+R2G+R2H and RM2B, R2C, R2D, R2H, R2E+R2F+R2G.

The following table describes the control scheme for the switches LOAD, S2A, S2B, S2C, S2D, S2E, S2F. It is largely the same as the one described in connection with FIG. 1.

| Step | LOAD | S2A | S2B | S2C | S2D | S2E | S2H |
|---|---|---|---|---|---|---|---|
| 200 | ON | OFF | OFF | OFF | OFF | OFF | OFF |
| 201 | OFF | ON | ON | OFF | OFF | ON | ON |
| 202 | OFF | ON | OFF | OFF | OFF | ON | ON |
| 203 | OFF | OFF | ON | OFF | OFF | ON | ON |
| 204 | OFF | ON | ON | OFF | OFF | ON | OFF |
| 205 | OFF | ON | ON | OFF | OFF | OFF | ON |
| 206 | OFF | OFF | OFF | ON | ON | ON | ON |
| 207 | OFF | OFF | OFF | ON | OFF | ON | ON |
| 208 | OFF | OFF | OFF | OFF | ON | ON | ON |
| 209 | OFF | OFF | OFF | ON | ON | ON | OFF |
| 210 | OFF | OFF | OFF | ON | ON | OFF | ON |

The switches S2E and S2H are used twice—for the measurement steps relating to the first resistor RM2A as well as the second resistor RM2B.

Variants of the control schemes based on the remarks in connection with FIG. 1 are possible.

The discharge times T201-T201 relating to the steps 201-210 depend on the resistors in the following way:

$$T201=(R2A\|R2B+RM2A+R2E\|(R2F+R2G+R2H))*C2 \quad (201)$$

$$T202=(R2A+RM2A+R2E\|(R2F+R2G+R2H))*C2 \quad (202)$$

$$T203=(R2B+RM2A+R2E\|(R2F+R2G+R2H))*C2 \quad (203)$$

$$T204=(R2A\|R2B+RM2A+R2E)*C2 \quad (204)$$

$$T205=(R2A\|R2B+RM2A+(R2F+R2G+R2H))*C2 \quad (205)$$

$$T206=(R2C\|R2D+RM2B+R2H\|(R2E+R2F+R2G))*C2 \quad (206)$$

$$T207=(R2C+RM2B+R2H\|(R2E+R2F+R2G))*C2 \quad (207)$$

$$T208=(R2D+RM2B+R2H\|(R2E+R2F+R2G))*C2 \quad (208)$$

$$T209=(R2C\|R2D+RM2B+R2H)*C2 \quad (209)$$

$$T210=(R2C\|R2D+RM2B+(R2E+R2F+R2G))*C2 \quad (210)$$

The equations (201)-(210) are similar to the equations (101)-(110). However, the resistors R2F and R2G are not determined individually but just the sums R2F+R2G+R2H and R2E+R2F+R2G.

With equations (201)-(205) the value of RM2A*C can be calculated by a post-processing function f1 of time measurements T101-T105. The value of RM2A*C2 depends on a post-processing function f1 of the measured discharge times as follows:

$$RM2A*C2=1(T201,T202,T203,T204,T205).$$

With equations 206 . . . 210 the value of RM2B*C can be calculated by a post-function f2 of time measurements T206-210. The value of RM2B*C2 depends on the post-processing function f2 of the measured discharge times as follows:

$$RM2B*C2=f2(T206,T207,T208,T209,T210).$$

The remaining capacitor C2 may be cancelled out by calculation of the ratio of the sensor resistors RM1A and RM1B:

$$V=RM2A/RM2B=f1(T201,T202,T203,T204,T205)/f2(T206,T207,T208,T209,T210).$$

Thus, if the value of one of the sensor resistors RM2A and RM2B is known, the other one may be calculated exactly.

Directly connecting the first and second terminals without switches may also be applied when sensing the resistances of three, four or more resistors. Previous principles can also be applied to three resistors with four-wire line connection, where only eight switches are necessary.

Figure 3:
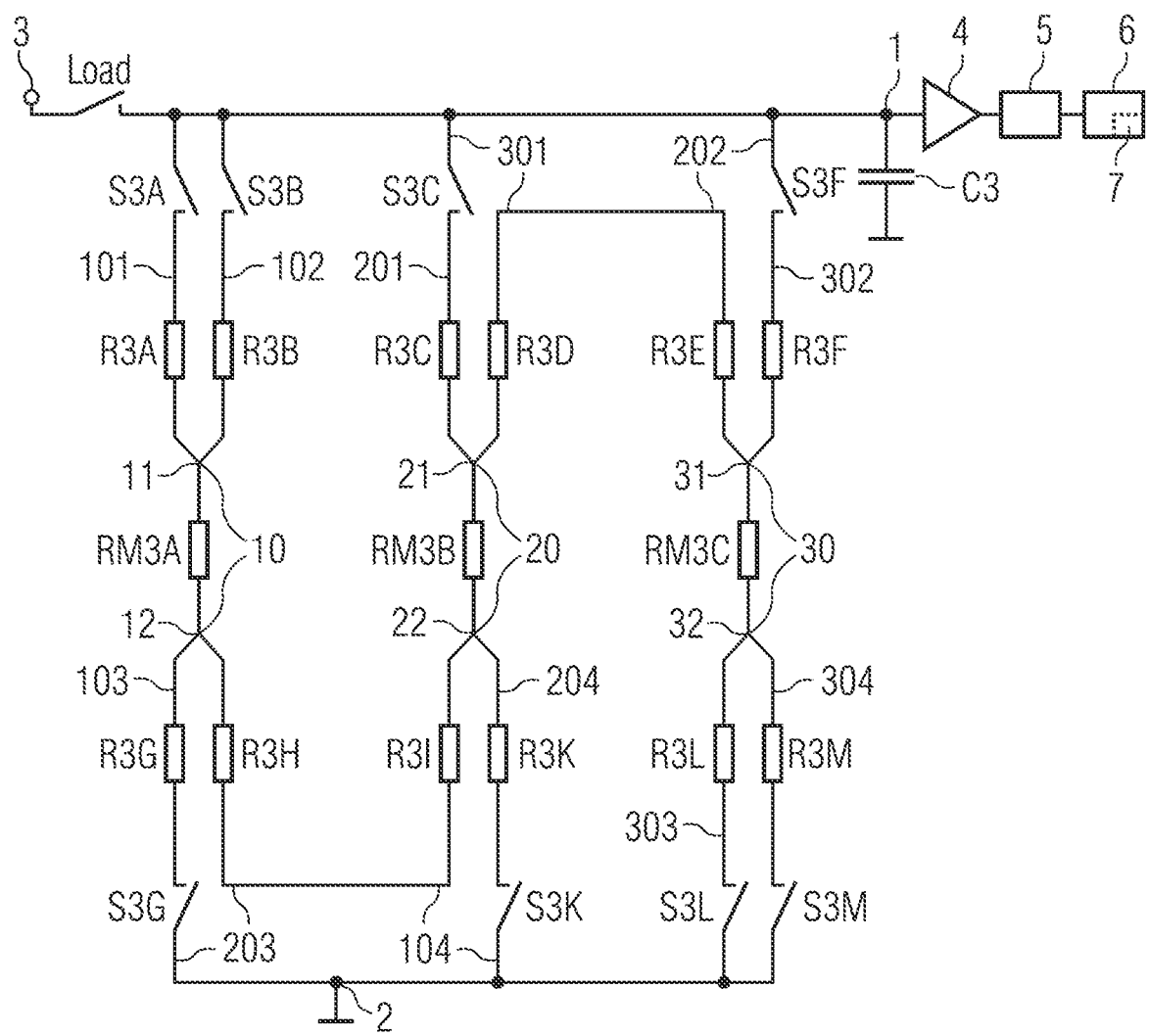
FIG. 3 shows a circuit diagram of a third embodiment of a circuit arrangement.

FIG. 3 shows a third embodiment of a circuit arrangement. To avoid a mere repetition of information, the following description of the embodiment concentrates on the differences between FIGS. 1, 2 and 3, which concerns the circuit between the first and second nodes 1, 2. Capacitor C3 is coupled in the same manner as the capacitor C2 in FIG. 2.

The circuit arrangement in FIG. 3 allows measuring of the resistances of a first resistor RM3A, a second resistor RM3B and a third resistor RM3C that are coupleable between a pair 10, 20, 30 of terminals each. In this embodiment, the first resistor RM3A is coupled between a first terminal 11 and a second terminal 12 of a first pair 10 of terminals. The second resistor RM3B is coupled between a first terminal 21 and a second terminal 22 of a second pair 20 of terminals. The third resistor RM3C is coupled between a third terminal 31 and a second terminal 32 of a third pair 30 of terminals.

The first terminal 11 of the first pair 10 is connected via a first circuit branch 101 to the first potential node 1. The first circuit branch 101 comprises a resistor R3A and a switch S3A. The first terminal 11 of the first pair 10 is connected via a second circuit branch 102 to the first potential node 1. The second circuit branch 102 comprises a resistor R3B and a switch S3B.

The second terminal 12 of the first pair 10 is connected via a third circuit branch 103 to the second potential node 2. The third circuit branch 103 comprises a resistor R3G and a switch S3G. The second terminal 12 of the first pair 10 is connected via a fourth circuit branch 104 to the second potential node 2. The fourth circuit branch 104 connected with the first pair 10 runs from the second terminal 12 of the first pair 10 via the second terminal 22 of the second pair 22 to the second potential node 2 and includes resistors R3H, R3I that are connected between the second terminals 12, 22 and a resistor R3K and a switch S3K. The resistors R3H and R3I may represent the line and contact resistances of a conducting line between the second terminals 12, 22.

The first terminal 21 of the second pair 20 is connected via a first circuit branch 201 to the first potential node 1. The first circuit branch 201 comprises a resistor R3C and a switch S3C. The first terminal 21 of the second pair 20 is connected via resistors R3D and R3E to the first terminal 31 of the third pair 30. A second circuit branch 202 connected with the second pair 20 runs from the first terminal 21 of the second pair 20 via the first terminal 31 of the third pair 30 to the first potential node 1 and includes the resistors R3D, R3E that are connected between the first terminals 21, 31 and a resistor R3F and a switch S3F. The resistors R3D and R3E may represent the line and contact resistances of a conducting line between the first terminals 21, 31.

The second terminal 22 of the second pair 20 is connected via the resistors R3I and R3H to the second terminal 12 of the first pair 10. The third circuit branch 203 connected with the second pair 20 runs from the second terminal 22 of the second pair 20 via the second terminal 12 of the first pair 12 to the second potential node 2 and includes the resistors R3I, R3H that are connected between the second terminals 12, 22 and the resistor R3G and the switch S3G. Thus, the third circuit branch 203 connected to a second pair 20 and the third circuit branch 103 connected to the first pair 10 have the resistor R3G and the switch S3G in common. The second terminal 22 of the second pair 20 is connected via a fourth circuit branch 204 to the second potential node 2. The fourth circuit branch 204 comprises a resistor R3K and a switch S3GK. Thus, the fourth circuit branch 204 connected to the second pair 20 and the fourth circuit branch 104 connected to the first pair 10 have the resistor R3K and the switch S3K in common.

The first terminal 31 of the third pair 30 is connected via resistors R3E and R3D to the first terminal 21 of the second pair 20. The first circuit branch 301 connected with the third pair 30 runs from the first terminal 31 of the third pair 30 via the first terminal 21 of the second pair 20 to the first potential node 1 and includes the resistors R3E, R3D that are connected between the first terminals 31, 21 and the resistor R3C and the switch S3C. Thus, the first circuit branch 301 connected to the third pair 30 and the first circuit branch 201 connected to the second pair 20 have the resistor R3C and the switch S3C in common. The first terminal 31 of the third pair 30 is connected via a second circuit branch 302 to the first potential node 1. The second circuit branch 302 comprises a resistor R3F and a switch S3F. Thus, the second circuit branch 302 connected to the third pair 30 and the second circuit branch 202 connected to the second pair 20 have the resistor R3F and the switch S3F in common.

The second terminal 32 of the third pair 30 is connected via a third circuit branch 303 to the second potential node 2. The third circuit branch 303 comprises a resistor R3L and a switch S3L. The second terminal 32 of the third pair 30 is connected via a fourth circuit branch 304 to the second potential node 2. The fourth circuit branch 304 comprises a resistor R3M and a switch S3M.

The resistors R3A, R3B, R3C, R3F, R3G, R3K, R3L, R3M and the switches S3A, S3B, S3C, S3F, S3G, S3K, S3L, S3M indicate switchable resistive connections between the terminals 11, 12, 21, 22, 31, 32 and the potential nodes 1, 2.

The circuit arrangement may be embodied by a chip integrating the switches LOAD, S3A, S3B, S3C, S3F, S3G, S3K, S3K, S3M, the threshold switch 4, the time-to-digital converter 5, the switch controller 7 and the processing unit 6. Such a chip may have eight pins for sensor resistor control. The conducting lines running to the terminals may be embodied on the printed circuit board.

Resistance measurement by the above-mentioned circuit arrangement is performed by charging the capacitor C3 by setting the switch LOAD into the conductive state. Then the switch LOAD is set into the insulating state and the switches S3A, S3B, S3G, S3K of the branches 101, 102, 103, 104 connected with the first pair 10 of terminals are set in such a manner that they allow discharging the capacitor C3 so that a current flows along at least one of the first and second branches 101, 102, the first resistor RM3A and at least one of the third and fourth branches 103, 104. Several charging and discharging steps are performed; the latter having different current paths from the first potential node 1 to the second potential node 2. Further charging and discharging steps are performed for measuring discharge times related to the second and third resistors RM3B, RM3C in a similar way as described in connection with FIGS. 1 and 2.

The discharge times may depend on the following unknown resistances: RM3A, R3A, R3B, R3G, R3H+R3I+R3K and RM3B, R3C, R3D+R3E+R3F, R3K, R3G+R3H+R3I and RM3C, R3F, R3C+R3D+R3E, R3L, R3M.

The control schemes and equation follow the considerations in connection with FIGS. 1 and 2. Two lines of two sensor resistors may be connected to one switch. The control scheme and the equations are not presented here.

Figure 4:
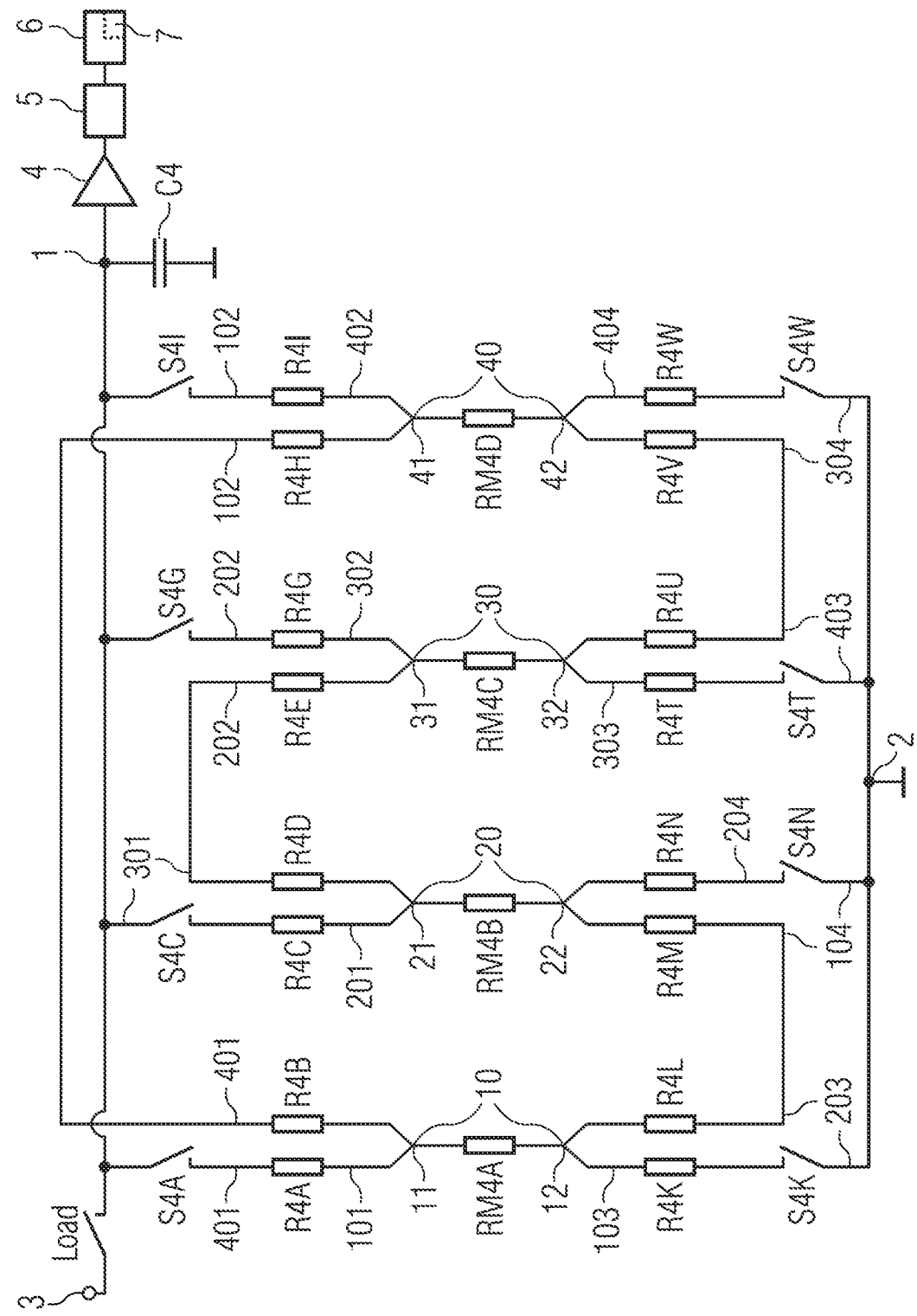
FIG. 4 shows a circuit diagram of a fourth embodiment of a circuit arrangement.

FIG. 4 shows a fourth embodiment of a circuit arrangement. To avoid a mere repetition of information, the following description of the embodiment concentrates on the differences between FIGS. 1, 2, 3 and 4, which concern the circuit between the first and second nodes 1, 2. Capacitor C4 is coupled in the same manner as the capacitor C2 in FIG. 2.

The circuit arrangement in FIG. 4 allows measuring of the resistances of a first resistor RM4A, a second resistor RM4B, a third resistor RM4C and a fourth resistor RM4D that are coupleable between a pair 10, 20, 30, 40 of terminals each. In this embodiment, the first resistor RM4A is coupled between a first terminal 11 and a second terminal 12 of a first pair 10 of terminals. The second resistor RM4B is coupled between a first terminal 21 and a second terminal 22 of a second pair 20 of terminals. The third resistor RM4C is coupled between a third terminal 31 and a second terminal 32 of a third pair 30 of terminals. The fourth resistor RM4D is coupled between a fourth terminal 41 and a second terminal 42 of a fourth pair 40 of terminals.

The first terminal 11 of the first pair 10 is connected via a first circuit branch 101 to the first potential node 1. The first circuit branch 101 comprises a resistor R4A and a switch S4A. The first terminal 11 of the first pair 10 is connected via resistors R4B and R4H to the first terminal 41 of the fourth pair 40. The second circuit branch 102 connected with the first pair 10 runs from the first terminal 11 of the first pair 10 via the first terminal 41 of the fourth pair 40 to the first potential node 1 and includes the resistors R4B, R4H that are connected between the first terminals 11, 41 and the resistor R4I and the switch S4I. The resistors R4B and R4H may represent the line and contact resistances of a conducting line between the first terminals 11, 41.

The second terminal 12 of the first pair 10 is connected via a third circuit branch 103 to the second potential node 2. The third circuit branch 103 comprises a resistor R4K and a switch S4K. The second terminal 12 of the first pair 10 is connected via resistors R4L and R4M to the second terminal 22 of the second pair 20. The fourth circuit branch 104 connected with the first pair 10 runs from the second terminal 12 of the first pair 10 via the second terminal 22 of the second pair 22 to the second potential node 2 and includes the resistors R4L, R4M that are connected between the second terminals 12, 22 and the resistor R4N and the switch S4N. The resistors R4L and R4M may represent the line and contact resistances of a conducting line between the second terminals 12, 22.

The first terminal 21 of the second pair 20 is connected via a first circuit branch 201 to the first potential node 1. The first circuit branch 201 comprises a resistor R4C and a switch S4C. The first terminal 21 of the second pair 20 is connected via resistors R4D and R4E to the first terminal 31 of the third pair 30. The second circuit branch 202 connected with the second pair 20 runs from the first terminal 21 of the second pair 20 via the first terminal 31 of the third pair 30 to the first potential node 1 and includes the resistors R4D, R4E that are connected between the first terminals 21, 31 and the resistor R4G and the switch S4G. The resistors R4D and R4E may represent the line and contact resistances of a conducting line between the first terminals 21, 31.

The second terminal 22 of the second pair 20 is connected via the resistors R4M and R4L to the second terminal 12 of the first pair 10. The third circuit branch 203 connected with the second pair 20 runs from the second terminal 22 of the second pair 20 via the second terminal 12 of the first pair 12 to the second potential node 2 and includes the resistors R4M, R4L that are connected between the second terminals 12, 22 and the resistor R4K and the switch S4K. Thus, the third circuit branch 203 connected to the second pair 20 and the third circuit branch 103 connected to the first pair 10 have the resistor R4K and the switch S4K in common. The second terminal 22 of the second pair 20 is connected via a fourth circuit branch 204 to the second potential node 2. The fourth circuit branch 204 comprises a resistor R4N and a switch S4N.

The first terminal 31 of the third pair 30 is connected via the resistors R4E and R4D to the first terminal 21 of the second pair 20. The first circuit branch 301 connected with the third pair 30 runs from the first terminal 31 of the third pair 30 via the first terminal 21 of the second pair 20 to the first potential node 1 and includes the resistors R4E, R4D that are connected between the first terminals 31, 21 and the resistor R4C and the switch S4C. Thus, the first circuit branch 301 connected to a third pair 30 and the first circuit branch 201 connected to the second pair 20 have the resistor R3C and the switch S3C in common. The first terminal 31 of the third pair 30 is connected via a second circuit branch 302 to the first potential node 1. The second circuit branch 302 comprises a resistor R4G and a switch S4G.

The second terminal 32 of the third pair 30 is connected via a third circuit branch 303 to the second potential node 2. The third circuit branch 303 comprises a resistor R4T and a switch S4T. The second terminal 32 of the third pair 30 is connected via resistors R4U and R4V to the second terminal 42 of the fourth pair 40. The fourth circuit branch 304 connected with the third pair 30 runs from the second terminal 32 of the third pair 30 via the second terminal 42 of the fourth pair 40 to the second potential node 2 and includes the resistors R4U, R4V that are connected between the second terminals 32, 42 and the resistor R4W and the switch S4W. The resistors R4U and R4V may represent the line and contact resistances of a conducting line between the second terminals 32, 42.

The first terminal 41 of the fourth pair 40 is connected via the resistors R4H and R4B to the first terminal 11 of the first pair 10. The first circuit branch 401 connected with the fourth pair 40 runs from the first terminal 41 of the fourth pair 40 via the first terminal 11 of the first pair 10 to the first potential node 1 and includes the resistors R4H, R4B that are connected between the first terminals 41, 11 and the resistor R4A and the switch S4A. Thus, the first circuit branch 401 connected to the fourth pair 40 and the first circuit branch 101 connected to the first pair 10 have the resistor R3A and the switch S3A in common. The first terminal 41 of the fourth pair 40 is connected via a second circuit branch 402 to the first potential node 1. The second circuit branch 402 comprises a resistor R4I and a switch S4I.

The second terminal 22 of the fourth pair 40 is connected via resistors R4V and R4U to the second terminal 32 of the third pair 30. The third circuit branch 403 connected with the fourth pair 40 runs from its second terminal 42 via the second terminal 32 of the third pair 12 to the second potential node 2 and includes the resistors R4V, R4U that are connected between the second terminals 42, 32 and the resistor R4T and the switch S4T. Thus, the third circuit branch 403 connected to a fourth pair 40 and the third circuit branch 303 connected to the third pair 30 have the resistor R4T and the switch S4T in common.

The second terminal 42 of the second pair 40 is connected via a fourth circuit branch 404 to the second potential node 2. The fourth circuit branch 404 comprises a resistor R4W and a switch S4W.

The resistors R4A, R4C, R4G, R4I, R4K, R4N, R4T, R4W and the switches S4A, S4C, S4G, S4I, S4K, S4N, S4T, S4W indicate switchable resistive connections between the terminals 11, 12, 21, 22, 31, 32, 41, 42 and the potential nodes 1, 2.

The circuit arrangement may be embodied by a chip having eight pins. Resistance measurement by the above-mentioned circuit arrangement is performed by charging the capacitor C4 by setting the switch LOAD into the conductive state. Then the switch LOAD is set into the insulating state and the switches S4A, S4I, S4K, S4N of the branches 101, 102, 103, 104 connected with the first pair 10 of terminals are set in such a manner that they allow discharging the capacitor C3 so that a current flows along at least one of the first and second branches 101, 102, the first resistor RM4A and at least one of the third and fourth branches 103, 104. Several charging and discharging steps are performed; the latter having different current paths from the first potential node 1 to the second potential node 1 through the first resistor RM4A. Further charging and discharging steps are performed through the second, third and fourth resistors RM4B, RM4C, RM4D.

The discharge times may depend on the following unknown resistances: RM4A, R4A, R4B+R4H+R4I, R4K, R4L+R4M+R4N and RM4B, R4C, R4D+R4E+R4G, 4N, R4K+R4L+R4M and RM4C, R4G, R4C+R4D+R4E, R4T, R4U+R4V+R4W and RM4D, R4I, R4A+R4B+R4H, R4W, R4T+R4U+R4V.

The control scheme and the equations follow the considerations above. Two lines of two sensor resistors may be connected to one switch. For measuring four-sensor resistors only eight pins are necessary.

The circuit arrangements in FIGS. 3 and 4 indicate connection schemes of four-wire sensors with eight ports or pins, which allows to reduce the number of pins from twelve or 16 to eight for three or four four-wire sensor resistors, respectively.

FIG. 5 shows a further embodiment of a circuit arrangement. To avoid a mere repetition of information, the following description of the embodiment concentrates on the differences between FIGS. 5 and 2.

The switches S5A, S5B, S5C, S5D, S5E, S5E, S5F, S5G, S5H and the resistors RM5A, RM5B, R5A, R5B, R5C, R5D, R5E, R5E, R5F, R5G, R5H and the capacitor C5 are coupled in the same manner as the switches S2A, S2B, S2C, S2D, S2E, S2E, S2F, S2G, S2H and the resistors RM2A, RM2B, R2A, R2B, R2C, R2D, R2E, R2E, R2F, R2G, R2H and the capacitor C2, respectively, shown in FIG. 2.

The circuit arrangement comprises further switches T5A, T5B, T5C, T5D connected to ports of the switches S5A, S5B, S5C, S5D that are not connected to the first potential node 1. The further switches T5A, T5B, T5C, T5D may force unused ports of the switches S5A, S5B, S5C, S5D to ground. Since open ports are sensitive as antennas, electromagnetic interferences may be coupled which might cause discharge and disturbance of the measurement. Forcing the unused ports to ground may prevent these effects. Thus, further switches T5A, T5B, T5C, T5D may act as port switches for EMC suppression.

The following table describes the control scheme of the switches LOAD, S2A, S2B, S2C, S2D, S2E, S2F and further switches T5A, T5B, T5C, T5D.

| Step | LOAD | S5A | S5B | S5C | S5D | S5E | S5H | T5A | T5B | T5C | T5D |
|---|---|---|---|---|---|---|---|---|---|---|---|
| 500 | ON  | OFF | OFF | OFF | OFF | OFF | OFF | ON  | ON  | ON  | ON  |
| 501 | OFF | ON  | ON  | OFF | OFF | ON  | ON  | OFF | OFF | ON  | ON  |
| 502 | OFF | ON  | OFF | OFF | OFF | ON  | ON  | OFF | OFF | ON  | ON  |
| 503 | OFF | OFF | ON  | OFF | OFF | ON  | ON  | OFF | OFF | ON  | ON  |
| 504 | OFF | ON  | ON  | OFF | OFF | ON  | OFF | OFF | OFF | ON  | ON  |
| 505 | OFF | ON  | ON  | OFF | OFF | OFF | ON  | OFF | OFF | ON  | ON  |
| 506 | OFF | OFF | OFF | ON  | ON  | ON  | ON  | ON  | ON  | OFF | OFF |
| 507 | OFF | OFF | OFF | ON  | OFF | ON  | ON  | ON  | ON  | OFF | OFF |
| 508 | OFF | OFF | OFF | OFF | ON  | ON  | ON  | ON  | ON  | OFF | OFF |
| 509 | OFF | OFF | OFF | ON  | ON  | OFF | ON  | ON  | ON  | OFF | OFF |
| 510 | OFF | OFF | OFF | ON  | ON  | ON  | OFF | ON  | ON  | OFF | OFF |

Whenever the switches SW5A or SW5B are OFF, the further switches T5C and T5D are tied to ground by setting them ON. Whenever the switches SW5C or SW5D are OFF, further switches T5A and T5A are tied to ground by setting them ON.

The discharge times depend on the resistors in the following way:

$$T501 = (R5A \| R5B + RM5A + R5E \| (R5F + R5G + R5H \| RP5B))*C5 \quad (501)$$

$$T502 = (R5A + RM5A + R5E \| (R5F + R5G + R5H \| RP5B))*C5 \quad (502)$$

$$T503 = (R5B + RM5A + R5E \| (R5F + R5G + R5H \| RP5B))*C5 \quad (503)$$

$$T504 = (R5 \| R5B + RM5A + R5E \| (R5F + R5G + RP5B)*C5 \quad (504)$$

$$T505 = (R5A \| R5B + RM5A + (R5F + R5G + R5H \| RP5B))*C5 \quad (505)$$

$$T506 = (R5C \| R5D + RM5B + R5H \| (R5G + R5F + R5E \| RP5A))*C5 \quad (506)$$

$$T507 = (R5C + RM5B + R5H \| (R5G + R5F + R5E \| RP5A))*C5 \quad (507)$$

$$T508 = (R5D + RM5B + R5H \| (R5G + R5F + R5E \| RP5A))*C5 \quad (508)$$

$$T509 = (R5C \| R5D + RM5B + R5H \| (R5G + R5F + RP5A))*C5 \quad (509)$$

$$T510 = (R5C \| R5D + RM5B + (R5G + R5F + R5E \| RP5A))*C5 \quad (510)$$

$$RP5A = RM5A + R5A \| R5B \quad (520)$$

$$RP5B = RM5B + R5C \| R5D \quad (521)$$

In comparison with the second embodiment, the unknown resistors have not changed. However, the structure of equations is modified.

The first resistor RM5A effects neither discharge of nor equations relating to the second resistor RM5B. The second resistor RM5B effects neither discharge of nor equations relating to the first resistor RM5A.

Nevertheless, a new calculation with functions f1 and f2 is necessary:

$$V = RM5A/RM5B = f1(T501 \ldots T505, T506 \ldots T510)/f2(T506 \ldots T510, T501 \ldots T505).$$

The circuit arrangement in FIG. 5 indicates a connection scheme of four-wire sensor resistors with six ports or pins and EMC suppression.

The scope of protection is not limited to the examples given herein above. The invention is embodied in each novel characteristic and each combination of characteristics, which particularly includes every combination of any features which are stated in the claims, even if this feature or this combination of features is not explicitly stated in the claims or in the examples.

REFERENCE NUMERALS 1, 2, 3 nodes
4 threshold switch
5 time-to-digital converter
6 processing unit
10, 20, 30, 40 pairs of terminals
11, 12, 21, 22, 31, 32,
41, 42 terminals
P pins
C1, C2, C3, C4, C5 capacitors
RM1A, RM1B, RM2A, RM2B,
RM3A, RM3B, RM3C, RM4A,
RM4B, RM4C, RM4D, RM5A, RM5B resistances of branches 101, 102, 103, 104, 201,
202, 203, 204, 301, 302,
303, 304, 401, 402, 403,
404 circuit branches
R1A ... RH1, R2A ... R2H,
R3A ... R3M, R4A ... R4W, R5A ... R5H resistors
S1A ... S1H, S2A ... S2H, S3A ... S3M,
S4A ... S4W, S5A ... S5H, LOAD switches
T5A, T5B, T5C, T5D switchable
VDD, GND potentials

The invention claimed is:

1. A circuit arrangement for resistance measurement of at least one resistor, the circuit arrangement comprising:
a capacitor coupled between a first potential node and a second potential node;
a pair of terminals comprising a first terminal and a second terminal, the first and second terminals being coupleable to one of the at least one resistor;
a set of circuit branches comprising a first circuit branch including a first switch, a second circuit branch including a second switch, a third circuit branch including a third switch, and a fourth circuit branch including a fourth switch,
wherein the switches are switchable between a conductive state and an insulating state,
wherein the first terminal is coupled to the first potential node via the first circuit branch and the second circuit branch, the first and second circuit branches being connected in parallel,
wherein the second terminal is coupled to the second potential node via the third circuit branch and the fourth circuit branch, the third and fourth circuit branches being connected in parallel;
a threshold switch coupled to the first potential node;
a further first switch coupling a node of the first circuit branch between the first switch and the first terminal to a ground potential; and
a further second switch coupling a node of the second circuit branch between the second switch and the first terminal to the ground potential.

2. The circuit arrangement according to claim 1,
wherein the pair of terminals is a first pair of terminals and the set of circuit branches is a first set of circuit branches,
wherein the circuit arrangement further comprises a second pair of terminals and a second set of circuit branches,
wherein the first terminal of the second pair is coupled to the first potential node via first and second circuit branches of the second set that are connected in parallel, and
wherein the second terminal of the second pair is coupled to the second potential node via third and fourth branches of the second set that are connected in parallel.

3. The circuit arrangement according to claim 2, wherein there is no direct conductive connection between the first terminals of the first and second pairs and there is no direct conductive connection between the second terminals of the first and second pairs.

4. The circuit arrangement according to claim 2,
wherein the first terminals of the first and second pairs are connected by a direct conductive connection, and
wherein the first circuit branches of the first and second sets comprise the same switch and the second circuit branches of the first and second sets comprise the same switch, or
wherein the second terminals of the first and second pairs are connected by a direct conductive connection, and
wherein the third circuit branches of the first and second sets comprise the same switch and the fourth circuit branches of the first and second sets comprise the same switch.

5. The circuit arrangement according to claim 2, further comprising
a third pair of terminals and a third set of circuit branches,
wherein the first terminal of the third pair is coupled to the first potential node via the first and second circuit branches of the third set that are connected in parallel,
wherein the second terminal of the third pair is coupled to the second potential node via the third and fourth circuit branches of the third set that are connected in parallel, and
wherein there is no direct conductive connection between at least two of the first terminals of the first, second and third pairs and there is no direct conductive connection between at least two of the second terminals of the first, second and third pairs.

6. The circuit arrangement according to claim 5,
wherein the second terminals of the first and second pairs are connected by a direct conductive connection, and
wherein the third circuit branches of the first and second sets comprise the same switch and the fourth circuit branches of the first and second sets comprise the same switch, and/or
wherein the first terminals of the second and third pairs are connected by a direct conductive connection, and
wherein the first circuit branches of the second and third sets comprise the same switch and the second circuit branches of the second and third sets comprise the same switch.

7. The circuit arrangement according to claim 5,
further comprising a fourth pair of terminals and a fourth set of circuit branches,
the first terminal of the fourth pair is coupled to the first potential node via the first and second circuit branches of the fourth set, that are connected in parallel,
wherein the second terminal of the fourth pair being coupled to the second potential node via the third and fourth circuit branches of the fourth set, that are connected in parallel, and
wherein there is no direct conductive connection between at least two of the first terminals of the first, second, third and fourth pairs and there is no direct conductive connection between at least two of the second terminals of the first, second, third and fourth pairs.

8. The circuit arrangement according to claim 7,
wherein the second terminals of the first and second pairs are connected by a direct conductive connection, and
wherein the third circuit branches of the first and second sets comprise the same switch and the fourth circuit branches of the first and second sets comprise the same switch, and/or
wherein the first terminals of the second and third pairs are connected by a direct conductive connection, and
wherein the first circuit branches of the second and third sets comprise the same switch and the second circuit branches of the second and third sets comprise the same switch, and/or
wherein the second terminals of the third and fourth pairs are connected by a direct conductive connection, and wherein the third circuit branches of the third and fourth sets comprise the same switch and the fourth circuit branches of the third and fourth sets comprise the same switch.

9. The circuit arrangement according to claim 1, wherein the further first switch connects the first switch with the ground potential when the first switch is in the insulating state, and/or wherein the further second switch connects the second switch with the ground potential when the second switch is in the insulating state.

10. The circuit arrangement according to claim 1, further comprising:
a current source or a voltage source configured to charge the capacitor; and
a sensor configured to measure a charge or discharge time of the capacitor.

11. The circuit arrangement according to claim 1, further comprising
a switch controller configured to set a plurality of switch settings, wherein, in each switch setting, the states of the switches are set in such a manner that the capacitor is chargeable or dischargeable via at least one of the first and second branches of a same set and at least one of the third and fourth circuit branches of the same set and a resistor coupled to the terminals that are connected to the same set.

12. The circuit arrangement according to claim 11, further comprising
a processor configured to determine a resistance value of the at least one resistor based on the measurements of a charge or discharge time for the plurality of switch settings.

13. A method for measuring a resistance by a circuit arrangement, wherein the circuit arrangement comprises a capacitor coupled between a first potential node and a second potential node, a first pair of terminals including a first terminal and a second terminal, the first and second terminals being coupled to a first resistor, a first set of circuit branches comprising a first circuit branch including a switch, a second circuit branch including a switch and a third circuit branch including a switch, wherein the first terminal is coupled to the first potential node via the first circuit branch and the second circuit branch, the first and second circuit branches being connected in parallel, wherein the second terminal is coupled to the second potential node via the third circuit branch, wherein the circuit arrangement comprises a second pair of terminals including a first terminal and a second terminal, the first and second terminals being coupled to a second resistor, a second set of circuit branches comprising a first circuit branch including a switch, a second circuit branch including a switch, and a third circuit branch including a switch, the first terminal being coupled to the first potential node via the first circuit branch and the second circuit branch, the first and second circuit branches being connected in parallel, wherein the second terminal is coupled to the second potential node via the third circuit branch, wherein the second terminals of the first and second pairs are connected by a direct conductive connection, the method comprising
charging and discharging the capacitor;
setting a switch setting; and
measuring a charge or discharge time of the capacitor for the switch setting,
wherein, in the switch setting, the switches are in such states that the capacitor is charged or discharged via a current path along at least one of the first branch or the second branch of the first set, the first resistor and at least one of the third branches of the first and second sets, or via a current path along at least one of the first branch or the second branch of the second set, the second resistor and at least one of the third branches of the first and the second sets.

14. The method according to claim 13, further comprising:
measuring the charge or discharge times for a plurality of switch settings forming different current paths for charging or discharging from the first potential node to the second potential node via a same resistor; and
calculating the resistance value of the same resistor based on measurements of the charge or discharge time for the plurality of switch settings.

15. A circuit arrangement for resistance measurement of at least one resistor, the circuit arrangement comprising:
a capacitor coupled between a first potential node and a second potential node;
a first pair of terminals comprising a first terminal and a second terminal, the first and second terminals being coupleable to a first resistor;
a first set of circuit branches comprising a first circuit branch including a switch, a second circuit branch including a switch, and a third circuit branch including a switch,
wherein the first terminal of the first pair is coupled to the first potential node via the first circuit branch and the second circuit branch of the first set of circuit branches, the first and second circuit branches of the first set of circuit branches being connected in parallel, and
wherein the second terminal of the first pair is coupled to the second potential node via the third circuit branch of the first set of circuit branches;
a second pair of terminals comprising a first terminal and a second terminal, the first and second terminals being coupleable to a second resistor; and
a second set of circuit branches comprising a first circuit branch including a switch, a second circuit branch including a switch, and a third circuit branch including a switch,
wherein the first terminal of the second pair is coupled to the first potential node via the first circuit branch and the second circuit branch of the second set of circuit branches, the first and second circuit branches of the second set of circuit branches being connected in parallel,
wherein the second terminal of the second pair is coupled to the second potential node via the third circuit branch of the second set of circuit branches,
wherein the switches are switchable between a conductive state and an insulating state, and
wherein the second terminal of the first pair of terminals and the second terminal of the second pair of terminals are connected by a direct conductive connection.

16. The circuit arrangement according to claim 15, further comprising a third pair of terminals and a third set of circuit branches,
wherein the first terminal of the third pair is coupled to the first potential node via the first and second circuit branches of the third set connected in parallel,
wherein the second terminal of the third pair is coupled to the second potential node via the third and fourth circuit branches of the third set connected in parallel, and
wherein there is no direct conductive connection between at least two of the first terminals of the first, second and third pairs and there is no direct conductive connection between at least two of the second terminals of the first, second and third pairs.

17. The circuit arrangement according to claim 15, further comprising:
a current source or a voltage source configured to charge the capacitor; and
a sensor configured to measure a charge or discharge time of the capacitor.

18. The circuit arrangement according to claim 15, further comprising
a switch controller configured to set a plurality of switch settings, wherein, in each switch setting, the states of the switches are set in such a manner that the capacitor is chargeable or dischargeable via at least one of the first and second branches of a same set and at least one of the third of the first and second sets and a resistor coupled to the terminals that are connected to the same set.

19. The circuit arrangement according to claim 15, wherein there is no direct conductive connection between the first terminals of the first and second pairs.

20. The circuit arrangement according to claim 15,
wherein the first terminals of the first and second pairs are connected by a direct conductive connection, and
wherein the first circuit branches of the first and second sets comprise the same switch and the second circuit branches of the first and second sets comprise the same switch.

* * * * *

UNITED STATES PATENT AND TRADEMARK OFFICE
CERTIFICATE OF CORRECTION

PATENT NO.        : 11,119,135 B2
APPLICATION NO.   : 16/605928
DATED             : September 14, 2021
INVENTOR(S)       : Friedrich Bahnmueller It is certified that error appears in the above-identified patent and that said Letters Patent is hereby corrected as shown below:

In the Claims

Claim 18, Column 23, Line 17, insert --branches-- after "third".

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*